United States Patent
Stebani et al.

(10) Patent No.: US 9,937,703 B2
(45) Date of Patent: Apr. 10, 2018

(54) DEVICE AND METHOD FOR THE IN-LINE PRODUCTION OF FLEXOGRAPHIC PRINTING PLATES

(71) Applicant: Flint Group Germany GmbH, Stuttgart (DE)

(72) Inventors: Uwe Stebani, Flörsheim-Dalsheim (DE); Gernot Dietz, Eisenberg (DE)

(73) Assignee: Flint Group Germany GmbH, Stuttgart (DE)

(*) Notice: Subject to any disclaimer, the term of this patent is extended or adjusted under 35 U.S.C. 154(b) by 19 days.

(21) Appl. No.: 15/024,650

(22) PCT Filed: Sep. 30, 2014

(86) PCT No.: PCT/EP2014/070865
§ 371 (c)(1),
(2) Date: Mar. 24, 2016

(87) PCT Pub. No.: WO2015/044437
PCT Pub. Date: Apr. 2, 2015

(65) Prior Publication Data
US 2016/0207299 A1    Jul. 21, 2016

(30) Foreign Application Priority Data
Sep. 30, 2013 (EP) ..................... 13186585

(51) Int. Cl.
*G03F 7/36* (2006.01)
*B41C 1/055* (2006.01)
*G03F 7/20* (2006.01)

(52) U.S. Cl.
CPC .............. *B41C 1/055* (2013.01); *G03F 7/201* (2013.01); *G03F 7/202* (2013.01); *G03F 7/2022* (2013.01); *G03F 7/36* (2013.01)

(58) Field of Classification Search
None
See application file for complete search history.

(56) References Cited

U.S. PATENT DOCUMENTS

| 5,262,275 A | 11/1993 | Fan |
| 5,552,262 A | 9/1996 | Konermann |
| 5,919,378 A | 7/1999 | Ferrante |

(Continued)

FOREIGN PATENT DOCUMENTS

| DE | 102010031527 A1 | 1/2012 |
| EP | 1069475 A1 | 1/2001 |

(Continued)

OTHER PUBLICATIONS

International Search Report for PCT/EP2014/070865 dated Feb. 3, 2015.

(Continued)

*Primary Examiner* — Chanceity Robinson
(74) *Attorney, Agent, or Firm* — Drinker Biddle & Reath LLP

(57) ABSTRACT

A device for automated implementation of preliminary reverse exposure, main exposure, and development of digitally imagable flexographic printing elements, and a method for producing flexographic printing plates starting from digitally imaged flexographic printing elements, using said apparatus.

7 Claims, 4 Drawing Sheets

(56) References Cited

U.S. PATENT DOCUMENTS

Figure 1:
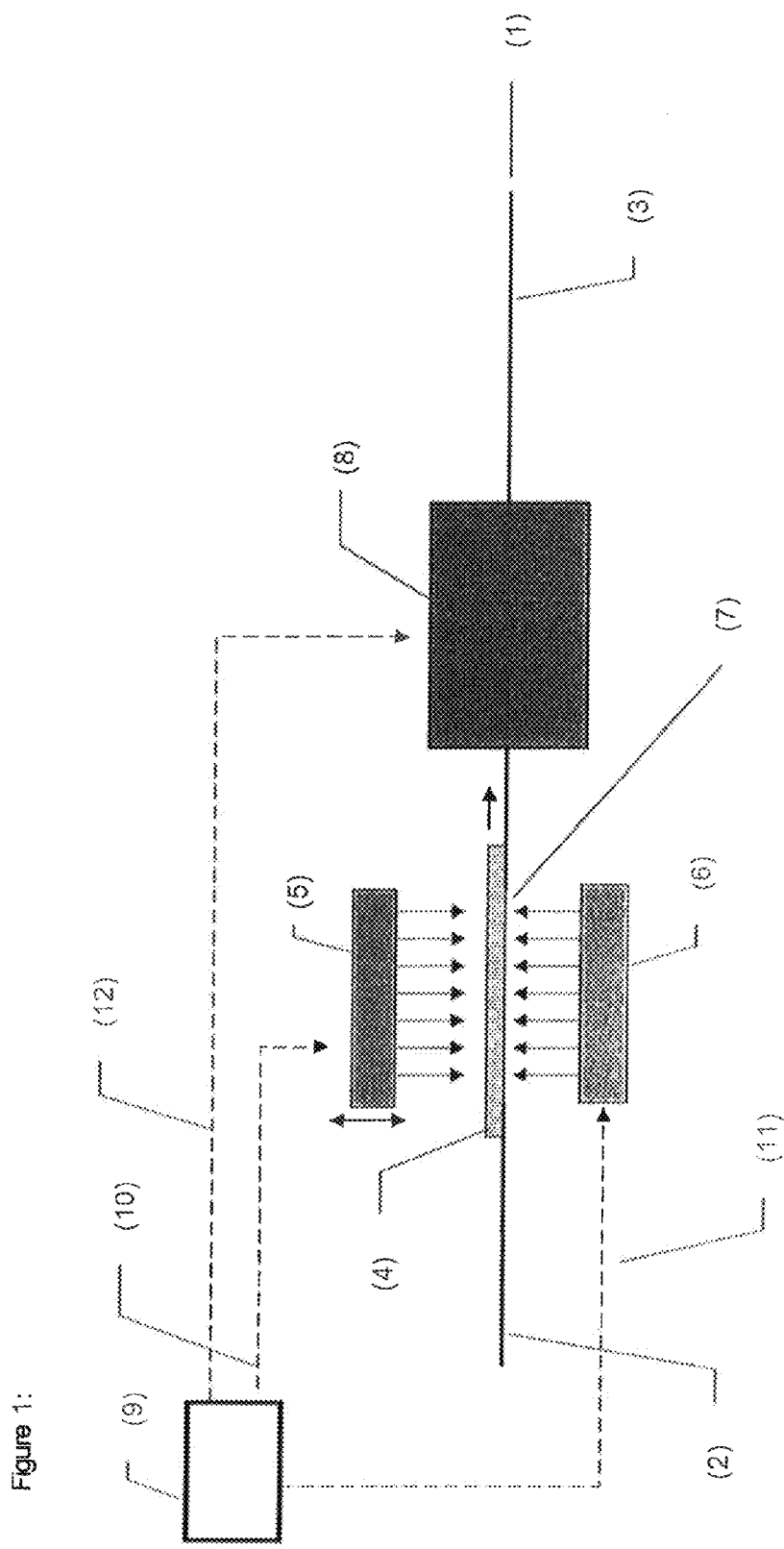

| | | | |
|---|---|---|---|
| 2004/0081908 A1 | 4/2004 | Shimazu et al. | |
| 2008/0280227 A1 | 11/2008 | Sievers | |
| 2009/0272286 A1* | 11/2009 | Wolterink | G03F 7/24 101/477 |
| 2013/0242276 A1* | 9/2013 | Schadebrodt | G03F 1/68 355/27 |

FOREIGN PATENT DOCUMENTS

| | | | |
|---|---|---|---|
| EP | 2317387 | A2 | 5/2011 |
| WO | WO-2004111725 | A2 | 12/2004 |
| WO | WO-2008135865 | A2 | 11/2008 |
| WO | WO-2012010459 | A1 | 1/2012 |

OTHER PUBLICATIONS

International Preliminary Examination Report for PCT/EP2014/070865 dated Apr. 2, 2015.

English translation of International Preliminary Report on Patentability for PCT/EP2014/070865 dated Mar. 31, 2016.

* cited by examiner

DEVICE AND METHOD FOR THE IN-LINE PRODUCTION OF FLEXOGRAPHIC PRINTING PLATES

CROSS-REFERENCE TO RELATED APPLICATIONS

This application is a national stage application (under 35 U.S.C. § 371) of PCT/EP2014/070865, filed Sep. 30, 2014, which claims benefit of European Application No. 13186585.9, filed Sep. 30, 2013, both of which are incorporated herein by reference in their entirety.

The present invention relates to a device for automated implementation of preliminary reverse exposure, main exposure, and development of digitally imagable flexographic printing elements. The invention further relates to a method for producing flexographic printing plates, starting from digitally imagable flexographic printing elements, using said apparatus.

Digitally imagable flexographic printing elements are known in principle. They comprise at least one dimensionally stable support, a photopolymerizable layer, and a digitally imagable layer. The digitally imagable layer may be, for example, a laser-ablatable layer, a layer which can be written using inkjet printers, or a thermographic layer; the most commonplace are laser-ablatable layers, also called LAMS (laser-ablatable mask system) layers.

Starting from photopolymerizable, digitally imagable flexographic printing elements, flexographic printing plates are produced by means of a multistage operation, using corresponding devices for each method step.

First of all a mask is written into the digitally imagable layer using an IR laser. This may involve laser apparatuses with rotating drum, or flatbed apparatuses.

Following the writing of the mask, the flexographic printing element is exposed through the mask formed, with UV radiation or UV/VIS radiation. The photopolymerizable layer undergoes polymerization in the regions no longer concealed by the mask, while in the concealed regions there is no polymerization. UV exposure units used for this purpose are units which may comprise various UV sources, examples being UV tubes or UV-LEDs.

Following exposure, the residues of the mask and also the unpolymerized fractions of the photopolymerizable layer are removed. This may be done using one or more solvents or else thermally. For washout by means of solvent, specialty washout equipment is used, examples being brush washers. For the thermal development it is possible to use equipment in which an absorbent nonwoven web is pressed by a heated roller onto the exposed layer.

When solvents are used to develop the plate, there follows a drying step in a dryer.

After the drying, the surface of the resulting flexographic printing plate is customarily aftertreated, by exposure of the surface with UVA and/or UVC radiation, for example. For this, again, corresponding exposure apparatuses are used.

For the production of flexographic printing plates, the devices for implementing the respective method steps must be loaded manually with the flexographic printing element ahead of each method step. After the method step has been implemented, the processed flexographic printing element must be removed manually from the device and supplied to the subsequent method step in each case. On account of this repeated need for manual interventions in the method, the production of flexographic printing plates is costly and inconvenient.

There have therefore been proposals of devices which combine the implementation of different method steps with one another in one apparatus and hence reduce the number of manual interventions.

U.S. Pat. No. 5,919,378 discloses a device for the automated processing of exposed round flexographic printing plates by washout, drying, and aftertreatment. Exposure is not integrated into the device, but is instead performed by means of a separate device. Following exposure, the exposed round printing plates are loaded manually into the processing device described.

WO 2012/010459 A1 discloses a method for producing flexographic printing plates that comprises a two-stage exposure. In a first exposure step, exposure takes place with actinic light having an intensity $\geq 100$ mW/cm$^2$ from a plurality of UV-LEDs, and in a second step exposure takes place with an intensity $<100$ mW/cm$^2$ with a radiation source other than UV-LEDs; preferably with a UV tube. WO 2012/010459 A1 further discloses a device for the in-line production of flexographic printing elements that comprises at least one first exposure unit with UV-LEDs, a second exposure unit with a radiation source other than LEDs, preferably a UV tube, a washout unit, and a drying unit. The device described further comprises transport units which connect the described units with one another. The device may optionally further comprise a unit for the digital imaging of the flexographic printing elements, an aftertreatment unit, and a delivery unit for the flexographic printing plates obtained. The specification, however, does not disclose any structural details of the device described.

The device described has a series of disadvantages.

Firstly, a two-stage exposure operation using different UV sources gives rise to greater complexity of apparatus than a single-stage exposure operation.

Secondly, the proposed device makes no provision for preliminary reverse exposure. "Preliminary reverse exposure" is understood by the skilled person as the brief preliminary exposure to UV light of the photopolymerizable, relief-forming layer of a flexographic printing element from the reverse, i.e., through the dimensionally stable support, ahead of the actual main exposure. It will be appreciated that for this purpose the dimensionally stable support is required to have at least a certain transparency for UV radiation. In the case of UV-impervious supports such as metallic supports, for example, there is of course no possibility of preliminary reverse exposure. In the course of the preliminary reverse exposure, a polymerized region is produced in the relief-forming layer, and can be used to set the relief depth of the nonimage regions to a desired dimension. As a result, fine relief elements in particular are anchored more effectively and hence are more stable during printing. With very thin flexographic printing elements, there is not necessarily a need for preliminary reverse exposure to be carried out, but with flexographic printing elements whose thickness is more than 1 mm (this figure relates, as usual, to the sum of the thicknesses of dimensionally stable support sheet and photopolymerizable layer) it is virtually indispensable if serious disadvantages affecting the printing properties of the resulting flexographic printing plate are to be avoided. In the apparatus proposed by WO 2012/010459 A1, therefore, relatively thick flexographic printing elements, at least, cannot be processed to a satisfactory outcome.

Thirdly, in the case of the device described, no account is taken of the fact that the speeds at which flexographic printing elements can be processed in the individual processing steps are heavily dependent on the nature of the flexographic printing elements used. The washout speed in particular is very dependent indeed on the thickness of the relief-forming layer. For instance, exposed, thin flexographic printing elements can generally be washed out at speeds up to 900 mm/min, whereas the washout speeds for thick flexographic printing elements are much lower, and may amount to only about 50 mm/min, for example. Reducing the processing speed by a factor of 10 in the case of thick plates would lead on exposure to an exposure time increased by a factor of 10, and hence to exposure outcomes that are entirely unsatisfactory. It is therefore not possible to process different plate thicknesses in the device proposed; instead, different devices must be held for different plate thicknesses, and this is not accepted by the market.

Moreover, the thicker the relief-forming layer, the longer the duration of the thermal development of exposed flexographic printing elements.

It was an object of the invention to provide an improved device for the in-line exposure of flexographic printing elements, allowing even flexographic printing elements with different thicknesses to be processed with satisfactory outcomes. Found accordingly has been a device for producing flexographic printing plates starting from digitally imaged flexographic printing elements, comprising at least one UV-transparent, dimensionally stable support sheet, a photopolymerizable, relief-forming layer, and a digitally imaged layer, the device comprising at least the following assemblies:

a transport device (1) for transporting the flexographic printing elements through the device, an exposure unit (6) disposed beneath the transport device, for the preliminary exposure of flexographic printing elements from the reverse by means of UV radiation, comprising at least one UV source regulatable in its power, an exposure unit (5) disposed above the transport device, for the main exposure of flexographic printing elements by means of UV radiation, comprising at least one UV source regulatable in its power, with the proviso that the unit (5) is disposed after the unit (6) in the transport direction, or that the exposure units (5) and (6) are disposed opposite one another, a developing unit (8) disposed after the exposure units in the transport direction, for removing the residues of the digitally imaged layer and also the unpolymerized fractions of the relief-forming layer, a control unit (9) for regulating the power of the unit (6) for preliminary reverse exposure, the power of the exposure unit (5) for main exposure, and the transport speed of the transport device.

In one preferred embodiment of the device, the developing unit (8) comprises a washout unit for removing the residues of the digitally imagable layer and also the unpolymerized fractions of the relief-forming layer using washout media.

Also found has been a method for producing flexographic printing plates starting from digitally imagable flexographic printing elements, the digitally imagable flexographic printing elements comprising at least one UV-transparent, dimensionally stable support sheet, a photopolymerizable, relief-forming layer, and a digitally imagable layer, and the method comprising at least the following method steps:

(A) writing a mask into the digitally imagable layer, (B) preliminary reverse exposure of the imaged flexographic printing element with UV or UV radiation through the UV-transparent support sheet, (C) exposing the imaged flexographic printing element with UV or UV radiation through the mask formed, (D) removing the residues of the digitally imagable layer and also the unpolymerized fractions of the relief-forming layer, where at least method steps (B), (C), and (D) are carried out using the stated device, the speed of the transport device being set at a fixed value by means of the control unit (9), and the power of the UV source for preliminary reverse exposure and also the power of the UV source for main exposure being set in accordance with the selected transport speed.

In one preferred embodiment of the method, method step (D) is carried out using washout media, and the flexographic printing plate obtained is dried in a further method step (E).

INDEX OF FIGURES

Figure 2:
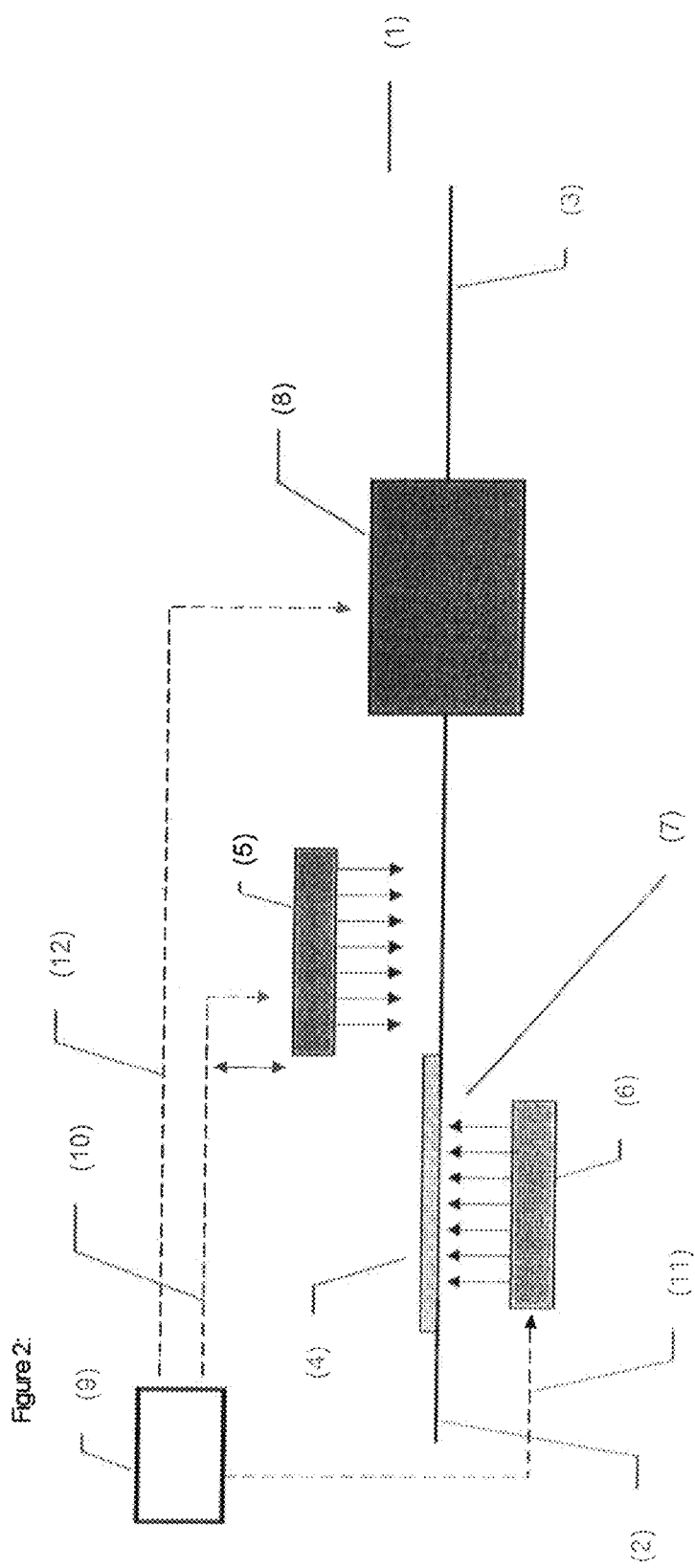
Figure 3:
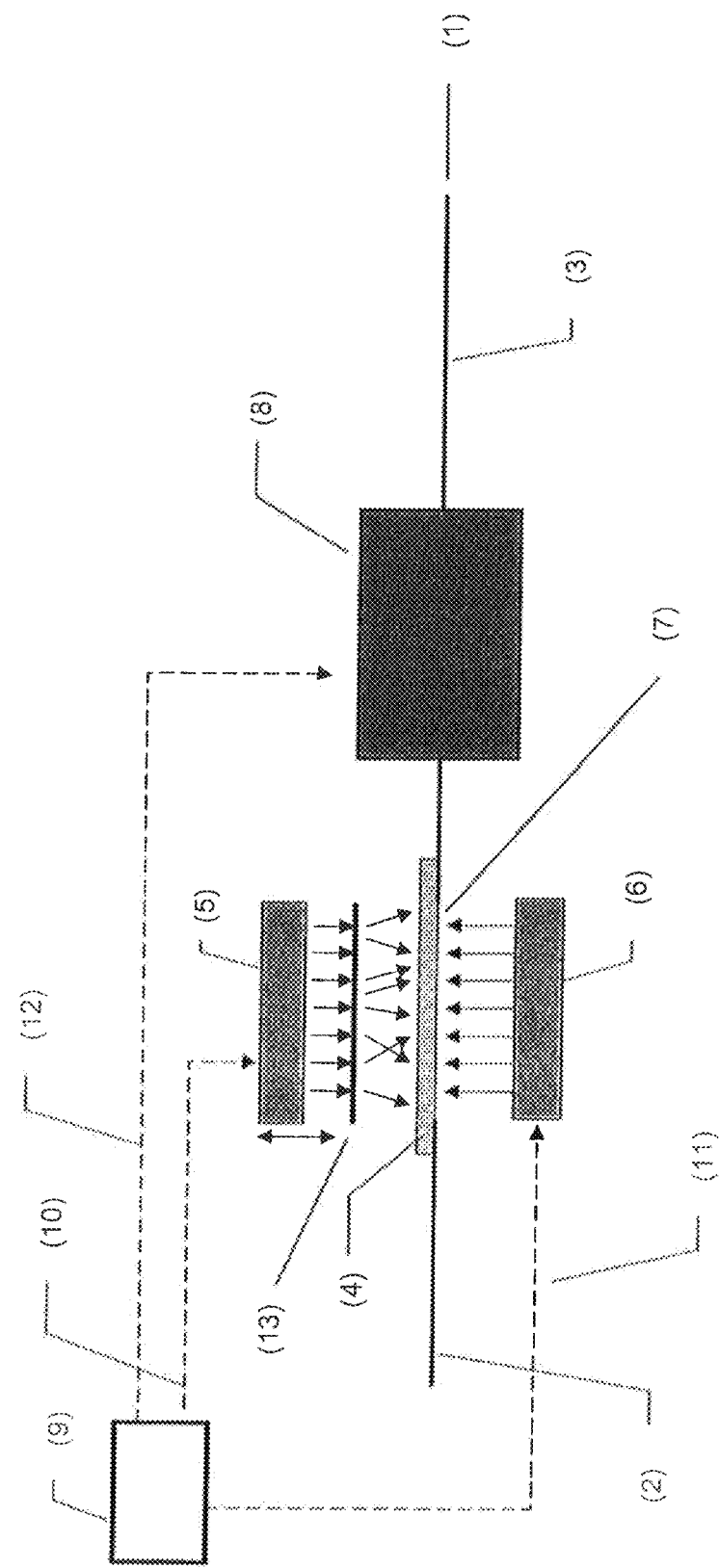
Figure 4:
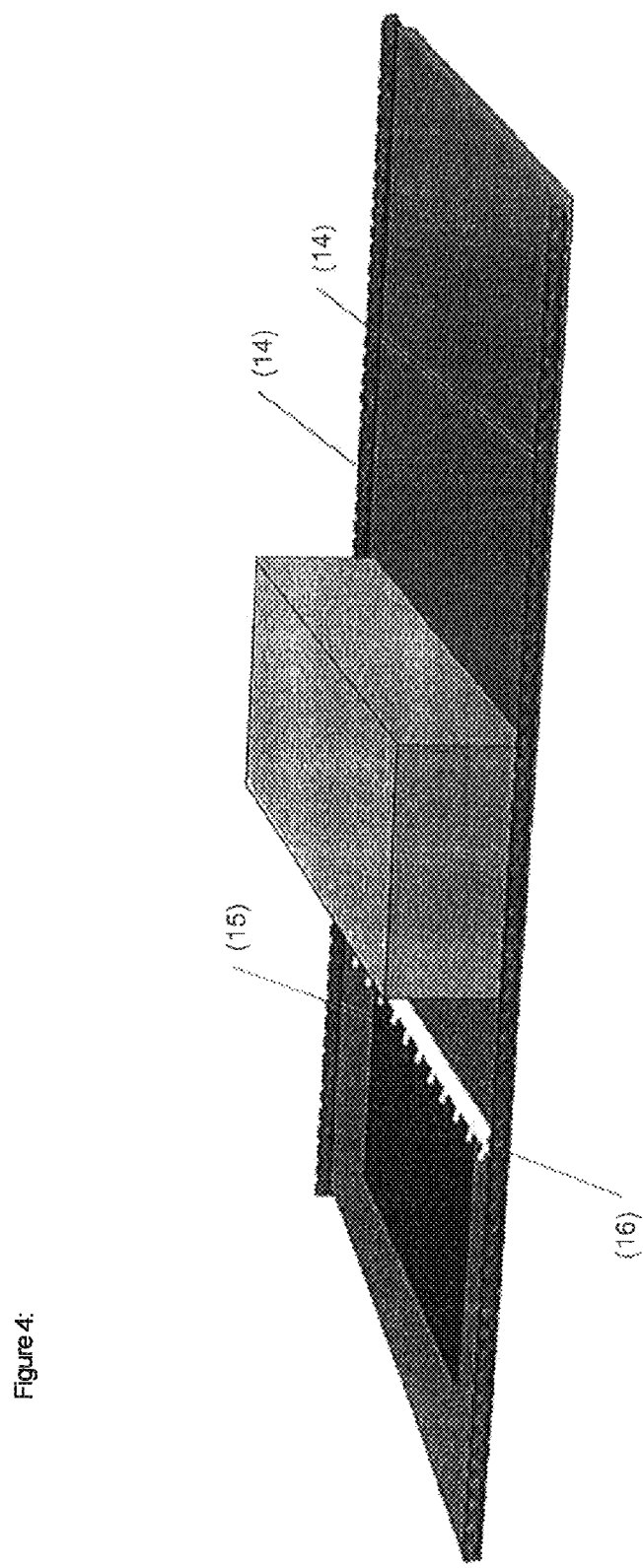

FIG. 1 diagrammatic representation of one embodiment of the device of the invention, comprising modules for preliminary reverse exposure, main exposure, and washout; preliminary reverse exposure and main exposure take place simultaneously FIG. 2 diagrammatic representation of another embodiment of the device of the invention, comprising modules for preliminary reverse exposure, main exposure, and washout; preliminary reverse exposure takes place first and then the main exposure FIG. 3 embodiment of the device with additional device for scattering UV light FIG. 4 diagrammatic representation of one embodiment of the transport device Regarding the invention in detail the following is observed:

In the text below, the terms "flexographic printing plate", "flexo plate", or "plate" are used for a print-ready printing plate which has already undergone crosslinking. The term "flexographic printing element" is used, as usual, for the photopolymerizable starting material which is used for producing flexographic printing plates.

Flexographic Printing Elements

The device of the invention is used in methods for processing digitally imagable flexographic printing elements in plate form into flexographic printing plates. The exposed flexographic printing elements can be developed using washout media or thermally.

Digitally imagable flexographic printing elements in plate form are known in principle to the skilled person, and they are available commercially. Examples of flexographic printing elements of this kind are described in U.S. Pat. No. 5,262,275 or EP-A 1 069 475, for example.

The digitally imagable flexographic printing elements comprise at least one dimensionally stable support sheet, a relief-forming, photopolymerizable layer, and also a digitally imagable layer. They may of course further comprise additional layers as well, such as adhesive layers, oxygen barrier layers, or a protective sheet on the digitally imagable layer, for example.

The support sheet has a thickness of 100 to 200 µm. As a general rule, a support sheet is composed of a material which is at least partly transparent for UV light, in order to allow the preliminary reverse exposure of the flexographic printing element. Examples of such materials include films of polymers such as polyethylene terephthalate, polybutylene terephthalate, and polyethylene naphthalate or polycarbonate, for example. Especially suitable are PET films with a thickness of 100 to 200 µm. Further conceivable, especially for thin flexographic printing elements, are foils of metals, such as aluminum foils, for example. In that case, however, preliminary reverse exposure is no longer possible. The photopolymerizable, relief-forming layer comprises at least one elastomeric binder, an ethylenically unsaturated monomer, and also a photoinitiator or photoinitiator system. Besides the components stated, there may optionally also may be further components present, such as plasticizers, for example. The layer in question is preferably a layer which is soluble in organic washout media, although of course flexographic printing elements with water-soluble relief-forming layers can also be processed in the device of the invention. The elastomeric binders may for example be thermoplastic-elastomeric block copolymers, examples being styrene-butadiene or styrene-isoprene block copolymers. The relief-forming layer generally has a thickness of 300 µm to 6000 µm, preferably 1000 µm to 5000 µm. Flexographic printing element used may of course also comprise a plurality of photopolymerizable, relief-forming layers with different compositions, one above another.

The digitally imagable layer may, for example, be a laser-ablatable layer, a layer which can be written using inkjet printers, or a thermographic layer. Preferably it is a laser-ablatable layer.

The laser-ablatable mask layer, also called LAMS layer, comprises at least one elastic binder, more particularly an elastomeric binder. It is of course also possible for mixtures of two or more different binders to be used. Examples of suitable binders include elastomeric polyamides. Polyamides of this kind comprise long-chain, difunctional fatty acids as monomeric building blocks, which give the polyamide elastomeric properties. Also used may be polyester amides, cellulose derivatives, nitrocellulose, ethylene-vinyl acetate copolymers, polyacrylates or mixtures of the stated polymers, provided they possess elastomeric properties.

The laser-ablatable mask layer further comprises materials which absorb UV/VIS light, where the layer thickness and/or the amount of the light-absorbing materials are generally made such that the optical density of the layer for UVA radiation is 2 to 4. The high optical density ensures that the regions of the relief-forming layer that are covered by the mask do not undergo polymerization in the course of the full-area exposure.

The UVA radiation range comprises light with a wavelength of 300 nm to 400 nm. The optical density is the logarithmic coefficient for the light intransmissibility of the layer within this wavelength range. In the measurement of the optical density, therefore, there is no determination of an individual value for light intransmissibility at a particular wavelength, but instead an average value is determined for the light intransmissibilities within a defined wavelength range. Optical density is customarily measured using commercially available densitometers (e.g., from x-rite), with the wavelength range being selected prior to measurement. For the purposes of the invention, all of the measurement values quoted for the optical density relate to the UVA range, i.e., the range from 300 to 400 nm.

Particularly suitable light-absorbing material comprises finely divided carbon black. Carbon black absorbs very well in the IR range as well, and therefore also ensures rapid imaging simultaneously in the case of imaging using IR lasers. Of course, however, the laser-ablatable mask layer may also comprise other pigment-based UV or IR absorbers or soluble dyes. Carbon black is customarily present in an amount of 10 to 50 wt %, based on the sum of all the components.

The thickness of the mask layer ought to be a few µm, preferably 1 µm to 4 µm. At layer thicknesses below 1 µm it is difficult to achieve sufficient optical density. At layer thicknesses above 3 µm, the laser sensitivity of the element is too low, meaning that long laser times are necessary for imaging. The laser sensitivity of the mask layer (measured as the energy needed in order to ablate 1 cm² of layer) ought to be between 1 and 4 mJ/cm², with a figure of about 2 mJ/cm² being optimum.

Device of the Invention

The device of the invention is used in methods for the processing of plate-form, digitally imagable flexographic printing elements to flexographic printing plates.

The device of the invention allows automated implementation at least of the method steps of reverse exposure, main exposure, and development. The device accordingly comprises at least a module for implementing preliminary reverse exposure, a module for implementing main exposure, and a module for developing exposed flexographic printing elements. The device further comprises a transport unit, by which the flexographic printing elements are transported through the device, and a control unit. The device may optionally further comprise additional modules for implementing further method steps.

FIG. 1 shows a diagrammatic representation of one embodiment of the device of the invention.

The device comprises a transport device (1), with which the flexographic printing elements for processing are transported through the modules of the device. The flexographic printing elements which have already been digitally imaged are introduced at the start (2) of the transport device, into the transport device, and the processed flexographic printing elements can be removed at the end (3) of the transport device. The term "digitally imaged" means that a mask has already been written into the digitally imagable layer, the flexographic printing element having been made ready, accordingly, for imagewise exposure.

One embodiment of the transport device (1) is shown in FIG. 4.

The transport device (1) shown comprises two transport elements (14) extending parallel to one another in the transport direction at a distance a from one another. These elements may, for example, be rotating transport chains, rotating toothed belts, or rotating spindles, in each case driven by a suitable drive unit.

The transport device (1) further comprises transport strips (15) with a length of at least a. The transport strips may be placed onto the two transport elements, perpendicularly relative to the two transport elements, by their respective ends (16), and are moved in the transport direction by the transport elements, by means of suitable catches.

The nature of the catches is dependent on the nature of the transport elements. Where the elements are chains or toothed belts, then catches, pins for example, can be arranged each in opposite pairs. Where the transport elements are spindles, the catches may be arranged in the lateral ends of the transport strips.

The distance a from one another limits the maximum width of the flexographic printing elements that can be processed with the device of the invention. Flexographic printing elements for processing can be narrower, but not wider, than the distance a.

The transport device may additionally have a base disposed between the two transport elements, with the flexographic printing elements lying on this base. The base need not be continuous.

For processing in the apparatus of the invention, the imaged flexographic printing elements are attached to a transport strip by their edge at the front in the transport direction, and are then placed onto the two transport elements at the start (2) of the transport device. After passing through the device, they can be removed again at the end (3).

The attachment of the flexographic printing elements may, for example, be accomplished by perforating the exposed flexographic printing elements along the leading edge, by means of a plate punch which is external or is integrated in the feed device, and hanging them in on transport strip pins disposed in accordance with the punched pattern. In another embodiment, the transport strip may be a clamping strip into which the flexographic printing elements can be clamped.

The device of the invention further comprises a main exposure unit (5) disposed above the transport device (1), and a preliminary reverse exposure unit (6), disposed beneath the transport device. In the region of preliminary reverse exposure (7), the base of the transport device is fabricated from a UV-transparent material. In one embodiment of the invention, the main exposure unit is height-adjustable, allowing the distance between exposure unit and plate surface to be varied. In the region of the "preliminary reverse exposure" module (7), the transport device may have a base made of a UV-transparent material, such as of UV-transparent glass, fused silica, or PMMA, for example.

The UV light sources in the main exposure unit (5) and the unit for preliminary reverse exposure (6) may in principle be any light sources, examples being UV tubes or UV-LEDs, in which case UV-LEDs are arranged, in a manner known in principle, in the form of diode arrays. In accordance with the invention the power of the UV light sources is regulatable. They are preferably UV-LEDs. In one embodiment the main exposure unit may comprise a diffusion disk (13) (see FIG. 3). This allows the UV light to be scattered and the irradiated area enlarged, or the uniformity of the radiant intensity over the irradiated area to be improved.

The distance between the surface of the flexographic printing element and UV-LEDs can be kept small and amounts customarily to 2 to 100 mm, preferably 2 to 20 mm, and, for example, 2 to 10 mm. The radiation from UV-LEDs has virtually no IR fraction, and so a high intensity with low distance from the flexographic printing element is also possible, without the risk of excessive thermal loading of the flexographic printing element.

In the case of other UV sources, owing to the IR fractions in the emitted radiation, larger distances must be maintained, of course.

The main exposure unit (5) and the unit for preliminary reverse exposure (6) may be disposed opposite one another as shown in FIG. 1, with main exposure and preliminary reverse exposure then taking place simultaneously. In a further embodiment of the device of the invention, shown in FIG. 2, the unit for preliminary reverse exposure (6) may be disposed ahead of the main exposure (5). In order to avoid scattered-light effects in the edge regions of the flexographic printing element, exposure ought to take place only in the width of the flexographic printing element. Advantageously, therefore, the exposure unit has shutters which reduce the exposure width to the width of the flexographic printing element.

The device of the invention further comprises a developing unit (8). The unit is disposed in such a way that after preliminary reverse exposure and main exposure, an image-wise-exposed flexographic printing element enters the developing unit (8). In the developing unit the residues of the digitally imagable layer, as for example the residues of the laser-ablatable mask layer and also of the unpolymerized fractions of the relief-forming layer, are removed. Where the flexographic printing element used still comprises further layers disposed above the relief-forming layer, these layers too are removed.

In one preferred embodiment of the invention the developing unit (8) comprises a washout unit (8a) for removing the residues of the digitally imagable layer and also the unpolymerized fractions of the relief-forming layer using washout media.

For this purpose, in a customary way, the washout unit may comprise a trough for receiving the washout media, feeds and drains for washout media, and also washout brushes. Mounted advantageously in the area beneath the brushes is a base for the flexographic printing elements, such as a perforated metal sheet, for example. The flexographic printing elements for washout can be drawn through the trough by means of the transport device depicted. The washout brushes serve for mechanical assistance to the washout process.

In a further embodiment of the invention, the developing unit (8) comprises a unit for thermal developing (8b), i.e., for thermally removing the residues of the digitally imagable layer and also the unpolymerized fractions of the relief-forming layer.

In this case, in a manner known in principle, the thermal developing unit comprises assemblies for heating the relief-forming layer and also assemblies for contacting the facing side of the heated, relief-forming layer with an absorbent material for absorbing photopolymerizable material in the liquid-melt state. The assemblies for heating may comprise a heatable underlay for the flexographic printing element and/or IR lamps disposed above the relief-forming layer. The absorbent material may be pressed against the surface of the flexographic printing element by means, for example, of an optionally heatable plate.

In accordance with the invention, the device further comprises a control unit (9). With the control unit, the power of each of the preliminary reverse exposure unit (6) and main exposure unit (5) can be controlled. It is also possible, furthermore, to regulate the speed of the transport device and hence the development time, as for example the washout time, of the flexographic printing element.

It is of course also possible optionally for further functions of the device to be cc by the control unit.

The device of the invention may optionally also comprise further assemblies.

Method of the Invention

The starting material used for the method of the invention is a digitally imagable flexographic printing element comprising at least one UV-transparent, dimensionally stable support sheet, a photopolymerizable, relief-forming layer, and digitally imagable layer, this element being processed to a print-ready flexographic printing plate. The method, in a manner known in principle, comprises at least the following method steps:

(A) writing a mask into the digitally imagable layer,
(B) preliminary reverse exposure of the imaged flexographic printing element with UV radiation through the UV-transparent support sheet,
(C) exposing the imaged flexographic printing element with UV radiation through the mask formed,
(D) removing the residues of the digitally imagable layer and also the unpolymerized fractions of the relief-forming layer.

In accordance with the invention at least method steps (B), (C), and (D) are carried out with the above-described device comprising at least a module for implementing preliminary reverse exposure, a module for implementing main exposure, a module for developing exposed flexographic printing elements, a transport unit, and a control unit.

Optionally, of course, the method may comprise additional method steps.

Method step (A) is carried out generally in a separate, preceding step. Apparatuses for imaging digitally imagable flexographic printing elements are known in principle to the skilled person.

For the implementation of the method of the invention, a digitally imaged flexographic printing element is connected to the feed device (3) with transport strips and is placed into the transport device (1). The device conveys the imaged flexographic printing element in the direction of the modules for preliminary reverse exposure, main exposure, and also for developing.

In one preferred embodiment of the invention, method step (D) is performed using a washout medium; that is, the unexposed portions of the relief-forming layer are dissolved in a suitable washout medium. For this purpose a device having a washout unit (8a) is used. In the case of this embodiment, the resulting flexographic printing plate is dried in a further method step (E). The surface of the dried flexographic printing plate may optionally be aftertreated with UV-A and/or UV-C light in a further method step (F). For the implementation of steps (E) and optionally (F), the washed-out flexographic printing plates can be removed via the delivery unit (3) of the device of the invention, and steps (E) and (F) are carried out in a manner which is known in principle.

In another embodiment of the invention, method step (D) is performed thermally. For this purpose a device having a thermal developing unit (8b) is used. In the case of this embodiment, the unpolymerized portions of the relief-forming layer, including the residues of the digitally imagable layer, are heated to the liquid-melt state, the surface of the relief-forming layer is contacted at least once with an absorbent material, the unpolymerized fractions of the relief-forming layer, in liquid-melt form, are drawn up by means of the absorbent material, and the contact of the absorbent material with the surface of the relief-forming layer is discontinued.

The speed at which the flexographic printing element is transported by the transport device is adjusted via the control unit (9), specifically in accordance with the required developing rate, in other words the rate of washout or of thermal development.

The developing rate is selected so as to allow for just complete removal of the unpolymerized fractions of the relief-forming layer. An even lower developing rate can of course also be selected, but this is not rational economically. The developing rate for a flexographic printing element is governed essentially by the thickness of the flexographic printing element, its construction, and—in the case of washout by means of washout media—the nature and temperature of the washout medium used, or—in the case of thermal development—the developing temperature. The conditions are selected accordingly by the skilled person. For commercially available flexographic printing elements, tables with recommended washout speeds exist; otherwise, the optimum washout speeds can easily be determined by the skilled person. Similar comments apply in respect of thermal developing.

Depending on the plate thickness, the transport speed is generally 50 mm/min to 900 mm/min. The minimum figure of 50 mm/min may be necessary when developing very thick plates, whereas it may be possible under certain circumstances for thin plates to be developed or washed at up to 900 mm/min.

On the basis of the transport speed set, the time required by the flexographic printing element in order to pass through the modules for preliminary reverse exposure and for main exposure is fixed, and therefore the exposure time as well is automatically fixed. As is seen, the transport speeds may differ by a factor of 10, and accordingly the exposure times as well may be different by a factor of 10.

In accordance with the invention, using the control unit (9), the power of the UV sources for preliminary reverse exposure and for main exposure is adapted in accordance with the fixed exposure time in such a way that there is satisfactory imagewise crosslinking of the relief-forming layer.

The invention claimed is:

1. A device for producing flexographic printing plates starting from digitally imaged flexographic printing elements, comprising at least one UV-transparent, dimensionally stable support sheet, a photopolymerizable, relief-forming layer, and a digitally imaged layer, comprising at least
  a transport device for transporting the flexographic printing elements at a constant transport speed through the device,
  an exposure unit disposed beneath the transport device, for the preliminary exposure of flexographic printing elements from the reverse by means of UV radiation, comprising at least one UV source regulatable in its power,
  an exposure unit disposed above the transport device, for the main exposure of flexographic printing elements by means of UV radiation, comprising at least one UV source regulatable in its power, with the proviso that the exposure unit is disposed after the exposure unit in the transport direction, or that the exposure units and are disposed opposite one another,
  a developing unit disposed after the exposure units in the transport direction, for thermally removing the residues of the digitally imaged layer and also the unpolymerized fractions of the relief-forming layer, and
  a control unit for regulating the power of the exposure unit for preliminary reverse exposure, the power of the exposure unit for main exposure, and the transport speed of the transport device.

2. The device as claimed in claim 1, wherein the UV source in the unit for main exposure comprises UV-LEDs.

3. The device as claimed in claim 1, wherein the UV source in the exposure unit for preliminary reverse exposure comprises UV-LEDs.

4. The device as claimed in claim 1, wherein the exposure unit is height-adjustable.

5. The device as claimed in claim 2, wherein the UV source in the exposure unit for preliminary reverse exposure comprises UV-LEDs.

6. The device as claimed in claim 5, wherein the exposure unit is height-adjustable.

7. A method for producing flexographic printing plates starting from digitally imagable flexographic printing elements, comprising at least one UV-transparent, dimensionally stable support sheet, a photopolymerizable, relief-forming layer, and a digitally imagable layer, comprising at least the following method steps:
  (A) writing a mask into the digitally imagable layer,
  (B) preliminary reverse exposure of the imaged flexographic printing element with UV radiation through the UV-transparent support sheet, (C) exposing the imaged flexographic printing element with UV radiation through the mask formed,
(D) removing the residues of the digitally imagable layer and also the unpolymerized fractions of the relief-forming layer, wherein
the unpolymerized fractions of the relief-forming layer, including the residues of the digitally imagable layer, are heated to a liquid-melt state,
the surface of the relief-forming layer is contacted at least once with an absorbent material,
the unpolymerized, liquid-melt fractions of the relief-forming layer are absorbed by means of the absorbent material, and
the contact between the absorbent material and the surface of the reliefforming layer is discontinued,
wherein at least method steps (B), (C), and (D) are carried out using a device as claimed in claim 1, the speed of the transport device being set at a fixed value by means of the control unit, and the power of the UV source for preliminary reverse exposure and also the power of the UV source for main exposure being set in accordance with the selected transport speed.

\* \* \* \* \*